United States Patent
Hunnicutt

(10) Patent No.: US 8,662,468 B2
(45) Date of Patent: Mar. 4, 2014

(54) MICROVALVE DEVICE

(75) Inventor: Harry Hunnicutt, Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 304 days.

(21) Appl. No.: 13/058,146

(22) PCT Filed: Jul. 9, 2009

(86) PCT No.: PCT/US2009/050063
§ 371 (c)(1),
(2), (4) Date: Feb. 8, 2011

(87) PCT Pub. No.: WO2010/019329
PCT Pub. Date: Feb. 18, 2010

(65) Prior Publication Data
US 2011/0127455 A1    Jun. 2, 2011

Related U.S. Application Data

(60) Provisional application No. 61/087,635, filed on Aug. 9, 2008.

(51) Int. Cl.
*F16K 31/00* (2006.01)

(52) U.S. Cl.
USPC .......................... 251/11; 251/129.01; 251/284

(58) Field of Classification Search
USPC .................. 251/129.01, 129.06, 284, 367, 11
See application file for complete search history.

(56) References Cited

U.S. PATENT DOCUMENTS

| | | |
|---|---|---|
| 668,202 A | 2/1901 | Nethery |
| 886,045 A | 4/1908 | Ehrlich et al. |
| 1,886,205 A | 11/1932 | Lyford |
| 1,926,031 A | 9/1933 | Boynton |
| 2,412,205 A | 12/1946 | Cook |
| 2,504,055 A | 4/1950 | Thomas |
| 2,651,325 A | 9/1953 | Lusignan |
| 2,840,107 A | 6/1958 | Campbell |
| 2,875,779 A | 3/1959 | Campbell |

(Continued)

FOREIGN PATENT DOCUMENTS

| | | |
|---|---|---|
| CN | 101617155 B | 3/2012 |
| DE | 2215526 | 10/1973 |

(Continued)

OTHER PUBLICATIONS

U.S. Appl. No. 09/309,316, Timothy Rin.

(Continued)

*Primary Examiner* — John Rivell
*Assistant Examiner* — Matthew W Jellett
(74) *Attorney, Agent, or Firm* — MacMillan, Sobanski & Todd, LLC

(57) ABSTRACT

A microvalve device includes a body, a valve element supported for movement relative to the body, and an actuator operatively coupled to the valve element for moving the valve element in a normal range of travel. A travel limiting structure operatively cooperates with at least one of the valve element and the actuator to effectively limit the magnitude of movement of the valve element or the actuator outside the normal range of travel to prevent failure of the body, the valve element, or the actuator due to exceeding failure stress limits. A method of forming a microvalve with such a travel limiting structure is also disclosed.

16 Claims, 7 Drawing Sheets

(56) References Cited

U.S. PATENT DOCUMENTS

| | | |
|---|---|---|
| 3,031,747 A | 5/1962 | Green |
| 3,729,807 A | 5/1973 | Fujiwara |
| 3,747,628 A | 7/1973 | Holster et al. |
| 3,860,949 A | 1/1975 | Stoeckert et al. |
| 4,005,454 A | 1/1977 | Froloff et al. |
| 4,019,388 A | 4/1977 | Hall, II et al. |
| 4,023,725 A | 5/1977 | Ivett et al. |
| 4,100,236 A | 7/1978 | Gordon et al. |
| 4,152,540 A | 5/1979 | Duncan et al. |
| 4,181,249 A | 1/1980 | Peterson et al. |
| 4,298,023 A | 11/1981 | McGinnis |
| 4,341,816 A | 7/1982 | Lauterbach et al. |
| 4,354,527 A | 10/1982 | McMillan |
| 4,434,813 A | 3/1984 | Mon |
| 4,476,893 A | 10/1984 | Schwelm |
| 4,543,875 A | 10/1985 | Imhof |
| 4,581,624 A | 4/1986 | O'Connor |
| 4,593,719 A | 6/1986 | Leonard |
| 4,628,576 A | 12/1986 | Giachino et al. |
| 4,647,013 A | 3/1987 | Giachino et al. |
| 4,661,835 A | 4/1987 | Gademann et al. |
| 4,687,419 A | 8/1987 | Suzuki et al. |
| 4,772,935 A | 9/1988 | Lawler et al. |
| 4,821,997 A | 4/1989 | Zdeblick |
| 4,824,073 A | 4/1989 | Zdeblick |
| 4,826,131 A | 5/1989 | Mikkor |
| 4,828,184 A | 5/1989 | Gardner et al. |
| 4,869,282 A | 9/1989 | Sittler et al. |
| 4,938,742 A | 7/1990 | Smits |
| 4,943,032 A | 7/1990 | Zdeblick |
| 4,946,350 A | 8/1990 | Suzuki et al. |
| 4,959,581 A | 9/1990 | Dantlgraber |
| 4,966,646 A | 10/1990 | Zdeblick |
| 5,029,805 A | 7/1991 | Albarda et al. |
| 5,037,778 A | 8/1991 | Stark et al. |
| 5,050,838 A | 9/1991 | Beatty et al. |
| 5,054,522 A | 10/1991 | Kowanz et al. |
| 5,058,856 A | 10/1991 | Gordon et al. |
| 5,061,914 A | 10/1991 | Busch et al. |
| 5,064,165 A | 11/1991 | Jerman |
| 5,065,978 A | 11/1991 | Albarda et al. |
| 5,066,533 A | 11/1991 | America et al. |
| 5,069,419 A | 12/1991 | Jerman |
| 5,074,629 A | 12/1991 | Zdeblick |
| 5,082,242 A | 1/1992 | Bonne et al. |
| 5,096,643 A | 3/1992 | Kowanz et al. |
| 5,116,457 A | 5/1992 | Jerman |
| 5,131,729 A | 7/1992 | Wetzel |
| 5,133,379 A | 7/1992 | Jacobsen et al. |
| 5,142,781 A | 9/1992 | Mettner et al. |
| 5,161,774 A | 11/1992 | Engelsdorf et al. |
| 5,169,472 A | 12/1992 | Goebel |
| 5,176,358 A | 1/1993 | Bonne et al. |
| 5,177,579 A | 1/1993 | Jerman |
| 5,178,190 A | 1/1993 | Mettner |
| 5,179,499 A | 1/1993 | MacDonald et al. |
| 5,180,623 A | 1/1993 | Ohnstein |
| 5,197,517 A | 3/1993 | Perera |
| 5,209,118 A | 5/1993 | Jerman |
| 5,215,244 A | 6/1993 | Buchholz et al. |
| 5,216,273 A | 6/1993 | Doering et al. |
| 5,217,283 A | 6/1993 | Watanabe |
| 5,222,521 A | 6/1993 | Kihlberg |
| 5,238,223 A | 8/1993 | Mettner et al. |
| 5,244,537 A | 9/1993 | Ohnstein |
| 5,267,589 A | 12/1993 | Watanabe |
| 5,271,431 A | 12/1993 | Mettner et al. |
| 5,271,597 A | 12/1993 | Jerman |
| 5,309,943 A | 5/1994 | Stevenson et al. |
| 5,323,999 A | 6/1994 | Bonne et al. |
| 5,325,880 A | 7/1994 | Johnson et al. |
| 5,333,831 A | 8/1994 | Barth et al. |
| 5,336,062 A | 8/1994 | Richter |
| 5,355,712 A | 10/1994 | Petersen et al. |
| 5,368,704 A | 11/1994 | Madou et al. |
| 5,375,919 A | 12/1994 | Furuhashi |
| 5,400,824 A | 3/1995 | Gschwendtner et al. |
| 5,417,235 A | 5/1995 | Wise et al. |
| 5,445,185 A | 8/1995 | Watanabe et al. |
| 5,458,405 A | 10/1995 | Watanabe |
| 5,467,068 A * | 11/1995 | Field et al. ............... 335/4 |
| 5,543,349 A | 8/1996 | Kurtz et al. |
| 5,553,790 A | 9/1996 | Findler et al. |
| 5,566,703 A | 10/1996 | Watanabe et al. |
| 5,577,533 A | 11/1996 | Cook, Jr. |
| 5,589,422 A | 12/1996 | Bhat |
| 5,611,214 A | 3/1997 | Wegeng et al. |
| 5,785,295 A | 7/1998 | Tsai |
| 5,810,325 A | 9/1998 | Carr |
| 5,838,351 A | 11/1998 | Weber |
| 5,848,605 A | 12/1998 | Bailey et al. |
| 5,856,705 A | 1/1999 | Ting |
| 5,873,385 A | 2/1999 | Bloom et al. |
| 5,909,078 A | 6/1999 | Wood et al. |
| 5,926,955 A | 7/1999 | Kober |
| 5,941,608 A | 8/1999 | Campau et al. |
| 5,954,079 A | 9/1999 | Barth et al. |
| 5,955,817 A | 9/1999 | Dhuler et al. |
| 5,970,998 A | 10/1999 | Talbot et al. |
| 5,994,816 A | 11/1999 | Dhuler et al. |
| 6,019,437 A | 2/2000 | Barron et al. |
| 6,023,121 A | 2/2000 | Dhuler et al. |
| 6,038,928 A | 3/2000 | Maluf et al. |
| 6,041,650 A | 3/2000 | Swindler et al. |
| 6,096,149 A | 8/2000 | Hetrick et al. |
| 6,105,737 A | 8/2000 | Weigert et al. |
| 6,114,794 A | 9/2000 | Dhuler et al. |
| 6,116,863 A * | 9/2000 | Ahn et al. ............... 417/322 |
| 6,123,316 A | 9/2000 | Biegelsen et al. |
| 6,124,663 A | 9/2000 | Haake et al. |
| 6,171,972 B1 | 1/2001 | Mehregany et al. |
| 6,182,742 B1 | 2/2001 | Takahashi et al. |
| 6,224,445 B1 | 5/2001 | Neukermans et al. |
| 6,255,757 B1 | 7/2001 | Dhuler et al. |
| 6,279,606 B1 | 8/2001 | Hunnicutt et al. |
| 6,283,441 B1 | 9/2001 | Tian |
| 6,386,507 B2 | 5/2002 | Dhuler et al. |
| 6,390,782 B1 | 5/2002 | Booth et al. |
| 6,408,876 B1 | 6/2002 | Nishimura et al. |
| 6,494,804 B1 | 12/2002 | Hunnicutt et al. |
| 6,505,811 B1 | 1/2003 | Barron et al. |
| 6,520,197 B2 | 2/2003 | Deshmukh et al. |
| 6,523,560 B1 | 2/2003 | Williams et al. |
| 6,533,366 B1 | 3/2003 | Barron et al. |
| 6,540,203 B1 | 4/2003 | Hunnicutt |
| 6,581,640 B1 | 6/2003 | Barron |
| 6,637,722 B2 | 10/2003 | Hunnicutt |
| 6,662,581 B2 | 12/2003 | Hirota et al. |
| 6,694,998 B1 | 2/2004 | Hunnicutt |
| 6,715,733 B2 * | 4/2004 | Wang et al. ............... 251/331 |
| 6,724,718 B1 | 4/2004 | Shinohara et al. |
| 6,755,761 B2 | 6/2004 | Hunnicutt et al. |
| 6,761,420 B2 | 7/2004 | Maluf et al. |
| 6,845,962 B1 | 1/2005 | Barron et al. |
| 6,872,902 B2 | 3/2005 | Cohn et al. |
| 6,902,988 B2 | 6/2005 | Barge et al. |
| 6,935,608 B2 * | 8/2005 | Claydon et al. ............... 251/61.1 |
| 6,958,255 B2 | 10/2005 | Khuri-Yakub et al. |
| 6,966,329 B2 | 11/2005 | Liberfarb |
| 7,011,378 B2 | 3/2006 | Maluf et al. |
| 7,063,100 B2 | 6/2006 | Liberfarb |
| 7,210,502 B2 | 5/2007 | Fuller et |
| 7,372,074 B2 | 5/2008 | Milne et al. |
| 7,449,413 B1 | 11/2008 | Achuthan et al. |
| 8,113,448 B2 | 2/2012 | Keating |
| 8,113,482 B2 | 2/2012 | Hunnicutt |
| 8,156,962 B2 | 4/2012 | Luckevich |
| 2002/0014106 A1 | 2/2002 | Srinivasan et al. |
| 2002/0029814 A1 | 3/2002 | Unger et al. |
| 2002/0096421 A1 | 7/2002 | Cohn et al. |
| 2002/0174891 A1 | 11/2002 | Maluf et al. |
| 2003/0061889 A1 | 4/2003 | Tadigadapa et al. |
| 2003/0098612 A1 | 5/2003 | Maluf et al. |
| 2003/0159811 A1 | 8/2003 | Nurmi |

(56) References Cited

U.S. PATENT DOCUMENTS

| | | |
|---|---|---|
| 2003/0206832 A1 | 11/2003 | Thiebaud et al. |
| 2004/0115905 A1 | 6/2004 | Barge et al. |
| 2005/0121090 A1 | 6/2005 | Hunnicutt |
| 2005/0200001 A1 | 9/2005 | Joshi et al. |
| 2005/0205136 A1 | 9/2005 | Freeman |
| 2006/0017125 A1 | 1/2006 | Lee et al. |
| 2006/0067649 A1 | 3/2006 | Tung et al. |
| 2006/0218953 A1 | 10/2006 | Hirota |
| 2007/0251586 A1 | 11/2007 | Fuller et al. |
| 2007/0289941 A1 | 12/2007 | Davies |
| 2008/0072977 A1 | 3/2008 | George et al. |
| 2008/0271788 A1 | 11/2008 | Matsuzaki et al. |
| 2009/0123300 A1 | 5/2009 | Uibel |
| 2009/0186466 A1 | 7/2009 | Brewer |
| 2010/0019177 A1 | 1/2010 | Luckevich |
| 2010/0038576 A1 | 2/2010 | Hunnicutt |
| 2010/0225708 A1 | 9/2010 | Peng et al. |
| 2012/0000550 A1 | 1/2012 | Hunnicutt |

FOREIGN PATENT DOCUMENTS

| | | |
|---|---|---|
| DE | 2930779 | 2/1980 |
| DE | 3401404 | 7/1985 |
| DE | 4101575 | 7/1992 |
| DE | 4417251 | 11/1995 |
| DE | 4422942 | 1/1996 |
| EP | 250948 | 1/1988 |
| EP | 261972 | 3/1988 |
| EP | 1024285 | 8/2000 |
| GB | 2238267 | 5/1991 |
| JP | Sho 39-990 | 2/1964 |
| JP | 04-000003 | 1/1992 |
| JP | 06-117414 | 4/1994 |
| JP | 01-184125 | 7/2001 |
| JP | 2003-049933 | 2/2003 |
| JP | 63-148062 | 7/2003 |
| JP | 2006-080194 | 3/2006 |
| WO | 99/16096 | 4/1999 |
| WO | 99/24783 | 5/1999 |
| WO | 00/14415 | 3/2000 |
| WO | 00/14415 A3 | 7/2000 |
| WO | 2005/084211 | 9/2005 |
| WO | 2005/084211 A3 | 1/2006 |
| WO | 2006/076386 A1 | 7/2006 |
| WO | 2008/076388 A1 | 6/2008 |
| WO | 2008/076388 B1 | 8/2008 |
| WO | 2008/121365 A1 | 10/2008 |
| WO | 2008/121369 A1 | 10/2008 |
| WO | 2010/019329 A2 | 2/2010 |
| WO | 2010/019329 A3 | 2/2010 |
| WO | 2010/019665 A2 | 2/2010 |
| WO | 2010/019665 A3 | 2/2010 |
| WO | 2010/065804 A2 | 6/2010 |
| WO | 2010/065804 A3 | 6/2010 |
| WO | 2011/022267 A2 | 2/2011 |
| WO | 2011/022267 A3 | 2/2011 |
| WO | 2011/094300 A2 | 8/2011 |
| WO | 2011/094300 A3 | 8/2011 |
| WO | 2011/094302 A2 | 8/2011 |
| WO | 2011/094302 A3 | 8/2011 |

OTHER PUBLICATIONS

Ayon et al., "Etching Characteristics and Profile Control in a Time Multiplexed ICP Etcher," Proc. of Solid State Sensor and Actuator Workshop Technical Digest, Hilton Head SC, (Jun. 1998) 41-44.
Bartha et al., "Low Temperature Etching of Si in High Density Plasma Using SF6/02," Microelectronic Engineering, and Actuator Workshop Technical Digest, Hilton Head SC, (Jun. 1998) 41-44.
Booth, Steve and Kaina, Rachid, Fluid Handling—Big Gains from Tiny Valve, Appliance Design (Apr. 2008), pp. 46-48.
Controls Overview for Microstaq Silicon Expansion Valve (SEV), Rev. 1, Dec. 2008 [online], [retrieved May 17, 2010]. Retrieved from the Internet <URL: http://www.microstaq.com/pdf/SEV_controls.pdf>.
Copeland, Michael V., Electronic valves promise big energy savings, Fortune, Sep. 9, 2008 [online], [retrieved Sep. 9, 2008]. Retrieved from the internet <URL: http://techland.blogs.fortune.cnn.com/2008/09/09/electronic-valves-promise-big-energy-savings>.
Fung et al., "Deep Etching of Silicon Using Plasma" Proc. of the Workshop on Micromachining and Micropackaging of Transducers, (Nov. 7-8, 1984) pp. 159-164.
Gui, C. et al, "Selective Wafer Bonding by Surface Roughness Control", Journal of the Electrochemical Society, 148 (4) G225-G228 (2001).
Gui, C. et al., "Fusion bonding of rough surfaces with polishing technique for silicon micromachining", Microsystem Technologies (1997) 122-128.
Günther, Götz, "Entwicklung eines pneumatischen 3/2-Wege-Mikroventils", O + P Olhydraulik Und Pneumatik, Vereinigte Fachverlage, Mainz, DE, vol. 42, No. 6, Jun. 1, 1998, pp. 396-398, XP000831050, ISSN: 03412660.
Higginbotham, Stacey, Microstaq's Tiny Valves Mean Big Energy Savings [online], [retrieved Sep. 9, 2008]. Retrieved from the Internet <URL: http//earth2tech.com/2008/09/09/microstaqs-tiny-valves-mean-big-energy savings (posted Dec. 8, 2008)>.
International Search Report dated Apr. 5, 2010 for Application No. PCT/US2009/053551.
J. Mark Noworolski, et al.,"Process for in-plane and out-of-plane single-crystal-silicon thermal microactuators", Sensors and Actuators A 55 (1996); pp. 65-69.
Jonsmann et al., "Compliant Electra-thermal Microactuators", IEEE Technical Digest , Twelfth IEEE International Conference on Micro Electro Mechanical Systems Jan. 17-21, 1999, Orlando, Florida, pp. 588-593, IEEE Catalog No. 99CH36291C.
K.R. Williams et al., "A Silicon Microvalve for the Proportional Control of Fluids", Transducers '99, Proc. 10th International Conference on Solid State Sensors and Actuators, held Jun. 7-10, 1999, Sendai, Japan, pp. 18-21.
Keefe, Bob, Texas firm says value-replacing chip can drastically cut energy use, Atlanta Metro News, Sep. 10, 2008 [online], [retrieved Sep. 10, 2008]. Retrieved from the Internet <URL: http://www.ajc.com/search/content/shared/money/stories/2008/09/microstaq10_cox-F9782.html>.
Klaassen et al., "Silicon Fusion Bonding and Deep Reactive Ion Etching; A New Technology for Microstructures," Proc., Transducers 95 Stockholm Sweden, (1995) 556-559.
Linder et al., "Deep Dry Etching Techniques as a New IC Compatible Tool for Silicon Micromachining," Proc, Transducers, vol. 91, (Jun. 1991) pp. 524-527.
Luckevich, Mark, MEMS microvlaves: the new valve world, Valve World (May 2007), pp. 79-83.
MEMS, Microfluidics and Microsystems Executive Review [online], [retrieved May 17, 2010]. Retrieved from the Internet <URL: http:www.memsinvestorjournal.com/2009/04/mems-applications-for-flow-control-.html>.
Microstaq Announces High Volume Production of MEMS-Based Silicon Expansion Valve [onlne], [retrieved Jan. 27, 2010]. Retrieved from the Internet <URL: http://www.earthtimes.org/articles/printpressstory.php?news+1138955 (posted Jan. 27, 2010)>.
Microstaq Product Description, Proportional Direct Acting Silicon Control Valve (PDA-3) [online], [retrieved May 17, 2010]. Retrieved from the Internet <URL: http://www.microstaq.com/products/pda3.html>.
Microstaq Product Description, Proportional Piloted Silicon Control Valve (CPS-4) [online], [retrieved May 17, 2010]. Retrieved from the Internet <URL: http://www.microstaq.com/products/cps4.html>.
Microstaq Product Descriptions, SEV, CPS-4, and PDA-3 [online], [retrieved May 17, 2010]. Retrieved from the Internet <URL: http://www.microstaq.com/products/index.html>.
Microstaq Technology Page [online], [retrieved May 17, 2010]. Retrieved from the Internet <URL: http://www.microstaq.com/technology/index.html>.
Petersen et al. "Surfaced Micromachined Structures Fabricated with Silicon Fusion Bonding" Proc., Transducers 91, (Jun. 1992) pp. 397-399.

(56) References Cited

OTHER PUBLICATIONS

Press Release, Freescale and Microstaq Join Forces on Smart Superheat Control System for HVAC and Refrigeration Efficiency (posted Jan. 22, 2008) [online], [retrieved May 17, 2010]. Retrieved from the Internet <URL: http://www.microstaq.com/pressReleases/prDetail_04.html>.
Press Release, Microstaq Mastering Electronic Controls for Fluid-Control Industry (posted May 5, 2005) [online[, [retrieved May 17, 2010]. Retrieved from the Internet <URL: http://www.microstaq.com/pressReleases/prDetail_02.html>.
Press Release, Microstaq Unveils Revolutionary Silicon Expansion Valve at Demo 2008 [online], [retrieved May 17, 2010]. Retrieved from the Internet <URL: http://www.microstaq.com/pressReleases/prDetail_05.html (posted Sep. 8, 2008)>.
Press Release, Nanotechnology Partnerships, Connections Spur Innovation for Fluid Control Industries (posted Jun. 9, 2005) [online], [retrieved May 17, 2010]. Retrieved from the Internet <URL: http://www.microstaq.com/pressReleases/prDetail_03.html>.
Product Review, greentechZONE Products for the week of May 18, 2009 [online], [retrieved May 17, 2010]. Retrieved from the Internet <URL: http://www.en-genius.net/site/zones/greentechZONE/product_reviews/grnp_051809>.
SEV Installation Instructions [online], [retrieved May 17, 2010]. Retrieved from the Internet <URL: http://www.microstaq.com/pdf/SEV_Instruction_sheet.pdf>.
Silicon Expansion Valve (SEV)—For Heating, Cooling, and Refrigeration Applications [online], [retrieved May 17, 2010]. Retrieved from the Internet <URL: http://www.microstaq.com/pdf/SEV_Quicksheet.pdf>.
Silicon Expansion Valve Data Sheet [online], [retrieved May 17, 2010]. Retrieved from the Internet <URL: http://www.microstaq.com/pdf/SEV_Datasheet_1_8.pdf>.
Silicon Expansion Valve Information Sheet [online], [retrieved May 17, 2010]. Retrieved from the Internet <URL: http://www.microstaq.com/pdf/SEV_Infosheet_2_0.pdf>.
SMIC Announces Successful Qualification of a MEMS Chip for Microstaq (posted Oct. 26, 2009) [online], [retrieved May 17, 2010]. Retrieved from the Internet <URL: http://www.prnewswire.com/news-releases/smic-announces-successful-qualification-of-a-mems-chip-for-microstaq-65968252.html (posted Oct. 26, 2009)>.
SMIC quals Microstaq MEMS chip for fluid control (posted Oct. 26, 2009) [online], [retrieved May 17, 2010]. Retrieved from the Internet <URL: http://www.electroiq.com/ElectroiQ/en-us/index/display/Nanotech_Article_Tools_Template.articles.small-times.nanotechmems.mems.microfluidics.2009.10.smic-quals_microstaq.html>.
Tiny Silicon Chip Developed by Microstaq Will Revolutionize Car Technology (posted May 19, 2005) [online], [retrieved May 9, 2005]. Retrieved from the Internet <URL: http://www.nsti.org/press/PRshow.html?id=160>.
Turpin, Joanna R., Soft Economy, Energy Prices Spur Interest in Technologies [online], [retrieved May 18, 2010]. Retrieved from the Internet <URL: http://www.achrnews.com/copyright/BNP_GUID_9-5-2006_A_10000000000000483182>.
Uibel, Jeff, The Miniaturization of Flow Control (Article prepared for the 9th International Symposium on Fluid Control Measurement and Visualization (FLUCOME 2007)), Journal of Visualization (vol. 11, No. 1, 2008), IOS Press.
Yunkin et al., "Highly Anisotropic Selective Reactive Ion Etching of Deep Trenches in Silicon," Microelectronic Engineering, Elsevier Science B.V., vol. 23, (1994) pp. 373-376.
Zhixiong Liu et al., "Micromechanism fabrication using silicon fusion bonding", Robotics and Computer Integrated Manufacturing 17 (2001) 131-137.
Biography, Ohio State University Website [online], [retrieved Dec. 31, 2000]. Retrieved from the Internet <URL: http://www.chemistry.ohio-state.edu/resource/pubs/brochure/madou.htm>.
Madou, Marc, "Fundamentals of Microfabrication", Boca Raton: CRC Press, 1997, 405-406.
Chinese Office Action dated Mar. 25, 2013, in counterpart Chinese patent application.

\* cited by examiner

US 8,662,468 B2

MICROVALVE DEVICE

CROSS-REFERENCE TO RELATED APPLICATIONS

This application claims the benefit of U.S. Provisional Application No. 61/087,635, filed Aug. 9, 2008, the disclosure of which is incorporated herein by reference.

BACKGROUND OF THE INVENTION

This invention relates in general to devices for MicroElectroMechanical Systems (MEMS), and in particular to a microvalve device having improved resistance to damage when subjected to external mechanical shocks.

MEMS (MicroElectroMechanical Systems) is a class of systems that are physically small, having features with sizes in the micrometer range or smaller. These systems have both electrical and mechanical components. The term "micromachining" is commonly understood to mean the production of three-dimensional structures and moving parts of MEMS devices. MEMS originally used modified integrated circuit (computer chip) fabrication techniques (such as chemical etching) and materials (such as silicon semiconductor material) to micromachine these very small mechanical devices. Today there are many more micromachining techniques and materials available. The term "micromachined device" as used in this application means a device having features with sizes in the micrometer range or smaller, and thus by definition is at least partially formed by micromachining. More particularly, the term "microvalve" as used in this application means a valve having features with sizes in the micrometer range or smaller, and thus by definition is at least partially formed by micromachining. The term "microvalve device" as used in this application means a micromachined device that includes a microvalve, and that may include other components. It should be noted that if components other than a microvalve are included in the microvalve device, these other components may be micromachined components or standard sized (larger) components. Similarly, a micromachined device may include both micromachined components and standard sized (larger) components.

Various microvalve devices have been proposed for controlling fluid flow within a fluid circuit. A typical microvalve device includes a displaceable member or valve component movably supported by a body for movement between a closed position and a fully open position. When placed in the closed position, the valve component substantially blocks or closes a first fluid port that is otherwise in fluid communication with a second fluid port, thereby preventing fluid from flowing between the fluid ports. When the valve component moves from the closed position to the fully open position, fluid is increasingly allowed to flow between the fluid ports.

U.S. Pat. Nos. 6,523,560; 6,540,203; and 6,845,962, the disclosures of which are incorporated herein by reference, describe microvalves made of multiple layers of material. The multiple layers are micromachined and bonded together to form a microvalve body and the various microvalve components contained therein, including an intermediate mechanical layer containing the movable parts of the microvalve. The movable parts are formed by removing material from an intermediate mechanical layer (by known micromachined device fabrication techniques, such as, but not limited to, Deep Reactive Ion Etching) to create a movable valve element that remains attached to the rest of the part by a spring-like member. Typically, the material is removed by creating a pattern of slots through the material of uniform width to achieve the desired shape. The movable valve element will then be able to move in one or more directions an amount roughly equal to the uniform slot width.

SUMMARY OF THE INVENTION

The invention relates to a microvalve device for controlling fluid flow in a fluid circuit. The microvalve device includes a body having a cavity formed therein. A valve element is supported by the body and movably disposed within the cavity. An actuator is operatively coupled to the valve element for moving the valve element in a normal range of travel to control the flow of a fluid through the microvalve device. The microvalve device further includes a travel limiting structure operatively cooperating with the valve element. The travel limiting structure is effective to limit the amount of movement of the valve element outside the normal range of travel to prevent structural failure of the valve element or the actuator due to excessive stress (exceeding failure stress limits, i.e., exceeding the yield point of the material) caused by excessive travel outside the normal range of travel. This invention also relates to a method of forming a microvalve with such a travel limiting structure.

Various objects and advantages of this invention will become apparent to those skilled in the art from the following detailed description of the preferred embodiments, when read in light of the accompanying drawings.

DETAILED DESCRIPTION OF THE PREFERRED EMBODIMENTS

Figure 1:
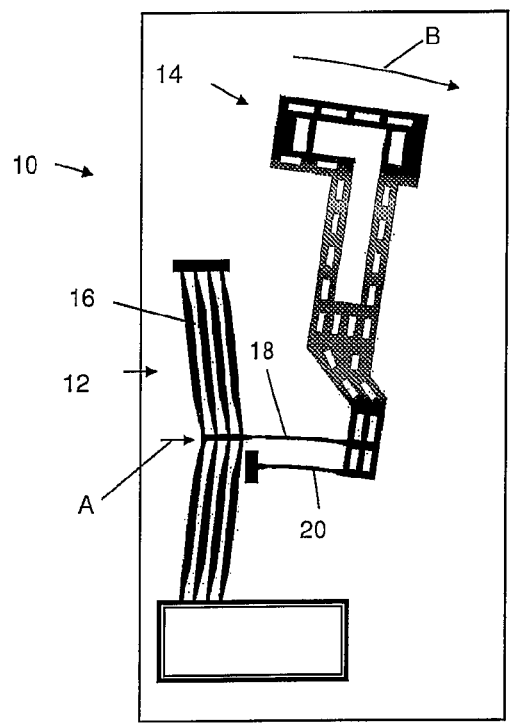
FIG. 1 is a top view of an intermediate mechanical layer of a microvalve, illustrating a normally actuated position of the valve element.

Referring now to FIGS. 1 through 6, an exemplary embodiment of a microvalve device, including a microvalve for controlling fluid flow is shown generally at 10. The microvalve 10 includes an actuator, indicated generally at 12, and a movable valve element, indicated generally at 14.

The actuator 12 may be of any suitable type of actuator. In the illustrated embodiment, the actuator 12 is a thermal actuator formed of a plurality of ribs 16 joined in a herringbone pattern to a central spine 18. When the ribs 16 are heated, such as by passing an electrical current through the ribs 16, the ribs 16 elongate. Each rib 16 is fixed to the central spine 18 at one end, and to a fixed portion 21 (see FIG. 3) of the microvalve 10. When the opposed inclined sets of ribs 16 elongate, the ribs 16 urge the central spine 18 of the actuator 12 in the direction "A", toward the valve element 14.

The valve element 14 is operatively coupled to the central spine 18 at a first location along the length of the valve element 14. The valve element 14 also includes a flexible hinge 20 at a second location, spaced apart from the first location. The flexible hinge 20 is operatively coupled at one end to the fixed portion 21. During actuation, movement of the central spine 18 causes the valve element 14 to bend the hinge 20, thus causing the valve element 14 to move along a path of arcuate motion indicated at "B". The actuator 12 moves the valve element 14 through a normal range of travel along the path of arcuate motion so as to selectively block and unblock one or more fluid ports 22 (see FIG. 4) in the microvalve 10, thus controlling fluid flow through the microvalve 10. When the actuator 12 is deenergized, the ribs 16 contract and the bending forces in the central spine 18 and the hinge 20 return the valve element 14 back toward an unactuated position.

Typically, the microvalve 10 may be formed of multiple layers of material bonded together to form a body. The body may include a top layer (not shown), a bottom layer (not shown), and an intermediate layer adjacently located between the top and bottom layers. The movable parts (including the actuator 12, the valve element 14, the ribs 16, the central spine 18, the hinge 20, and any other movable parts of the microvalve 10) may be formed by removing material from the intermediate layer. The material is removed from around the moving parts to separate the moving parts from the fixed portion 21 of the body. More specifically, the material may be removed by creating a pattern of slots through the material of the intermediate layer to achieve the desired shape. Additionally, it may be desirable to form shallow recesses (not shown) in fixed portions of the body outside of the intermediate layer that are adjacent to the moveable parts of the microvalve 10, so as to limit friction between the movable parts of the microvalve 10 and the adjacent fixed parts of the body of the microvalve 10.

As can be seen in the figures, various openings 24 (vents, ducts, or apertures) may be formed perpendicularly (that is, perpendicular to a plane defined by the motion within which the valve element 14 is constrained to move during normal range of travel) through various portions of the valve element 14. One effect of such openings 24 is to help prevent or diminish pressure imbalances between the perpendicularly opposed surfaces of the valve element 14, so that the valve element 14 is not urged into "out of plane" movement so as to drag against the layers of material (not shown) adjacent to the intermediate layer from which the movable parts are fabricated.

As indicated above, the microvalve 10 of the illustrated embodiment has a valve element 14 actuated by the actuator 12. The actuator 12 is operated by heating the ribs 16 by the application of electrical power. The selective heating of the ribs 16 of the microvalve 10 causes movement due to differential thermal expansion of the material. The stresses in the movable parts and the fixed portion 21 caused by this actuation are designed to be in a safe range (i.e., less than the failure stress limits—that is, the yield point—for the material or materials forming the movable parts and the fixed portion 21) that will not cause damage to the movable parts or fixed portion 21 even after repeated cycling of the power applied.

Figure 2:
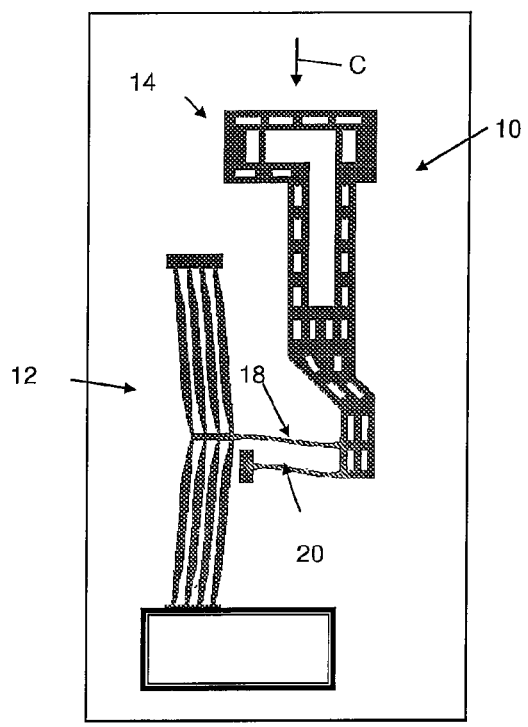
FIG. 2 is a view similar to FIG. 1, except showing the valve element displaced by a mechanical shock to a stressed position.
Figure 3:
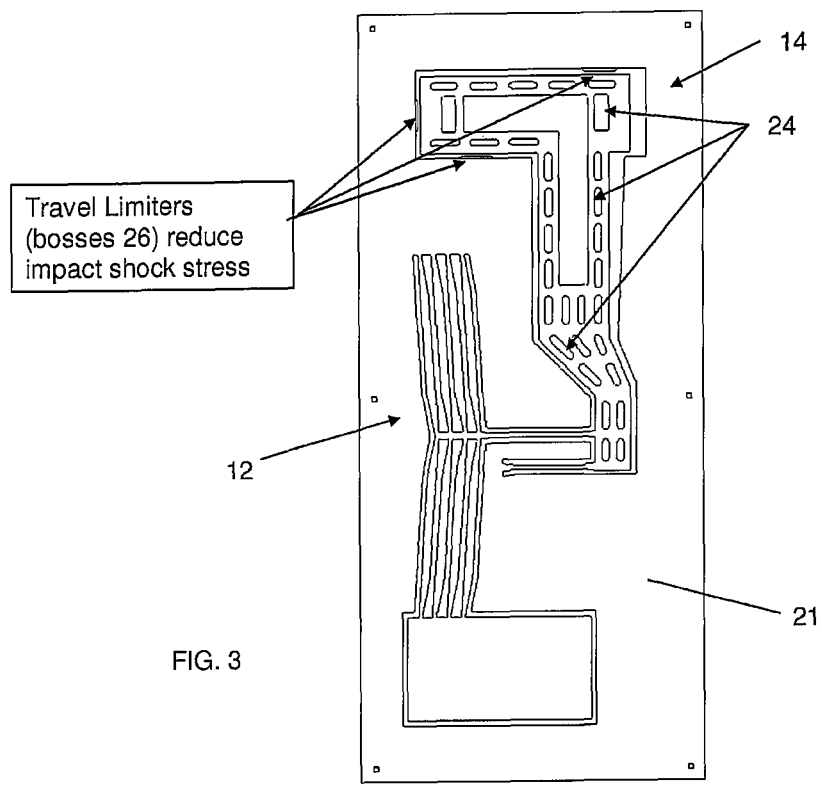
FIG. 3 is a view similar to FIG. 1, showing the provision of a travel limiting structure to limit motion of the valve element in the event the microvalve is subjected to a mechanical shock.

However, the movable parts of the microvalve 10 may be caused to move by forces other than those caused intentionally by the applied power. For example, a shock load due to dropping the microvalve 10 may cause the movable parts to move in an unplanned fashion outside the normal range of travel, as shown in FIG. 2. The movable parts may move in one or more directions an amount equal to the uniform slot width, or more (in the case of movement toward a corner, for instance). These movements may cause the movable parts, particularly the spine 18 and the hinge 20, and the parts of the fixed portion 21 to which the movable parts are attached, or come into contact with, to be stressed in ways that do not occur during normal actuation. The level of stress may approach or exceed the failure stress limits potentially causing failure of the movable parts or the fixed portion 21 of the microvalve 10.

It may therefore be desirable to limit the amount of motion of the movable parts outside of a normal range of travel, and more specifically, to limit the amount of motion of the movable elements to a small enough motion outside of the normal range of travel to prevent failure of the microvalve 10. For example, in the illustrated embodiment, the motion of the valve element 14 is limited to a normal range of travel defined by a path of arcuate motion. However, it should be appreciated that, while moving outside the normal range of travel, the magnitude of movement of the valve element 14 may be limited, that is, the magnitude of travel outside the normal range of travel may be restricted to a non-zero value which, nevertheless is sufficiently restricted that the failure stress limits are not reached in the components of the microvalve 10. Similarly, the magnitude of movement of the other movable parts (e.g., the ribs 16, the central spine 18, or the hinge 20) outside their normal range of travel during normal actuation may also be limited.

Figure 4:
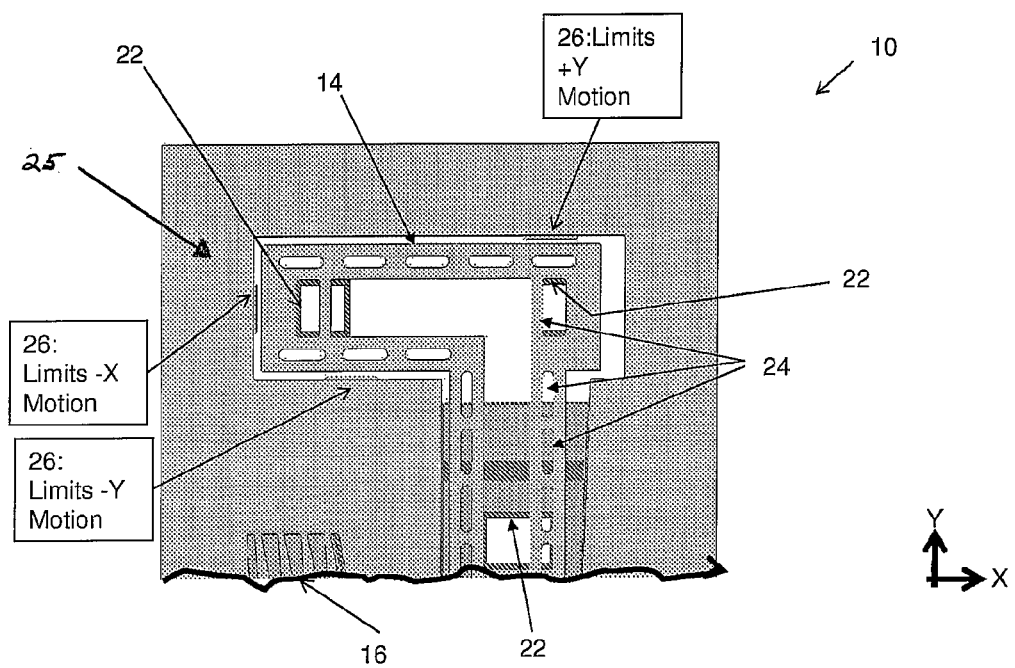
FIG. 4 is an enlarged view of a portion of the valve element shown in FIG. 3.

To limit the amount of movement of the movable parts of the microvalve 10 outside of the normal range of travel to an amount that is insufficient to cause the moveable parts to exceed failure stress limits and fail, the illustrated microvalve 10 includes a travel limiting structure, indicated generally at 25. The travel limiting structure 25 may include one or more bosses 26 extending above the general level of a surrounding surface, or may include other suitable features (not shown), that act to limit motion of the moveable parts of the microvalve 10 outside of the normal range of travel so that failure stress limits are not exceeded, so that the movable elements and the fixed portion 21 do not fail. As best seen in FIG. 4, a plurality of bosses 26 may be formed on the fixed portion 21 of the body. It should be appreciated that the bosses 26 may instead, or additionally, be formed on any of the movable parts of the microvalve 10, such as the valve element 14, without departing from the scope of this invention.

Figure 5:
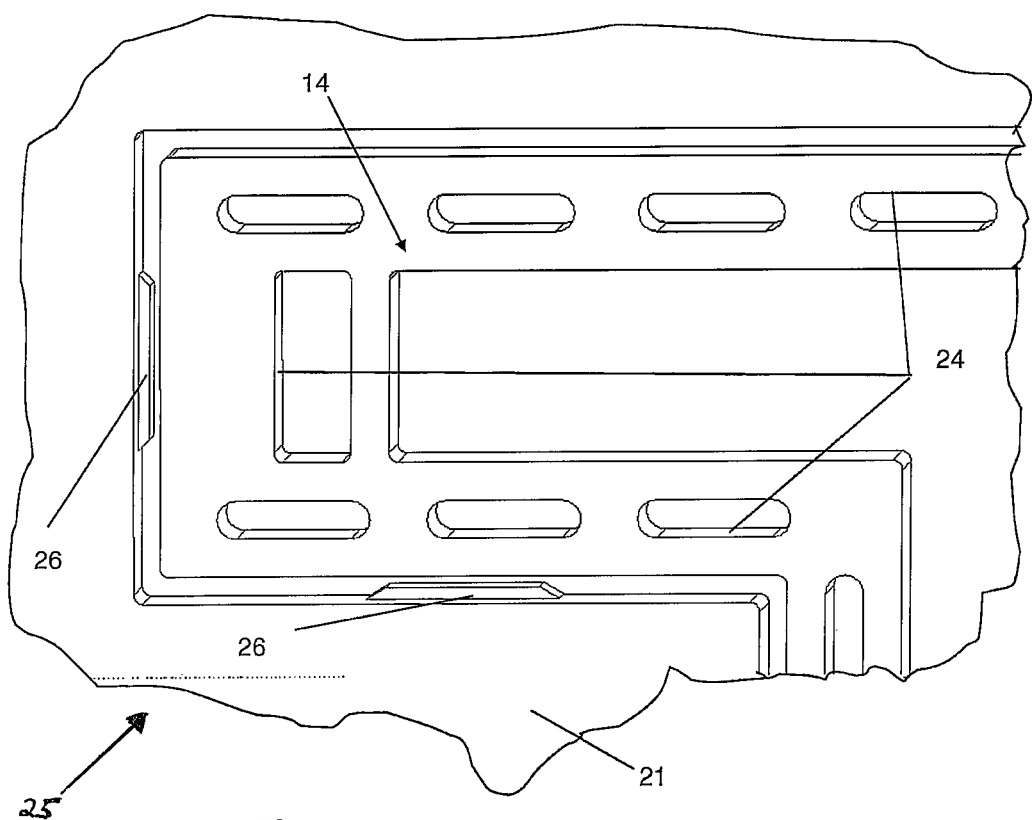
FIG. 5 is a view similar to FIG. 4, but showing an even more enlarged view of a portion of the valve element shown in FIG. 3.

In the illustrated embodiment, the plurality of bosses 26 are configured to limit the magnitude of travel of the microvalve in the + and −Y directions (e.g., travel in a radial direction relative to the path of arcuate motion), and in the −X direction (e.g., uncommanded overtravel in an arcuate motion to the left of the illustrated unactuated position shown in FIGS. 4 and 5), while permitting motion in the +X direction, which is the direction of normal actuation. Thus, the plurality of bosses 26 which constitute the travel limiting structure 25 are effective to limit the magnitude of the travel of the movable valve element 14 outside the normal range of travel. By thus limiting the undesired travel of the valve element 14, in the event of an external mechanical shock or other force tending to cause the valve element 14 to move in the +Y or −Y, or −X directions, the movement of the valve element 14 can be constrained to a relatively small range of motion outside the normal range of travel so that neither the movable parts nor the fixed portion 21 reach stress levels which could cause the movable parts or the fixed portion 21, and thus the microvalve 10, to fail. Of course, the exact location or locations at which it would be desirable to provide a boss 26 or other feature of the travel limiting structure 25 is dependent upon the design of a particular microvalve.

Furthermore, some microvalve designs may allow uncommanded movement of a moveable valve element in a direction outside of a plane defined by the normal motion of the microvalve movable element sufficient to cause a movable element or fixed portion of the microvalve to exceed the failure stress limits of the material of which it was made, and fail. A travel limiting structure 25 may therefore also be configured to limit movement of the movable parts outside the plane of motion as defined by the normal range of travel of the valve element 14. In such a microvalve 10, a travel limiting structure 25 may include at least one boss or other feature (not shown) formed at a suitable location on the surface (not shown) of a cavity, or on another surface, of a fixed part of the body other than the intermediate layer (for example, in an adjacent layer of a multi-layer microvalve). Such a travel limiting structure 25 could be positioned at a location to limit the magnitude of movement outside a normal range of motion of the movable elements of the microvalve to an amount which would prevent the movable elements or fixed portion 21 from failing due to exceeding failure stress limits.

Thus, the microvalve 10 may be provided with a travel limiting structure 25 that limits the magnitude of movement occurring outside of a normal range of movement, regardless of the direction of such movement. Such a microvalve 10 may have improved robustness and shock resistance compared to a microvalve device which is otherwise the same in structure and performance but not provided with a travel limiting structure 25.

A method of manufacturing a travel limiting structure 25, as described above, may include the following steps. In a first step 101, the method includes determining a proper configuration for the travel limiting structure 25 that would be effective to limit the amount of travel of the moveable parts outside the normal range of travel. The proper configuration of the travel limiting structure 25 may be based on a determination of the maximum allowable range of travel of the moving parts outside the normal range of travel so that the movable parts do not reach stress limits which could cause any portion of the microvalve 10 to fail. As described above, the travel limiting structure 25 may be located on the fixed portion 21 of the intermediate layer, on the movable valve element 14, on a fixed part of the body other than the intermediate layer (for example, in an adjacent layer of a multi-layer microvalve), or any combination thereof.

Figure 6:
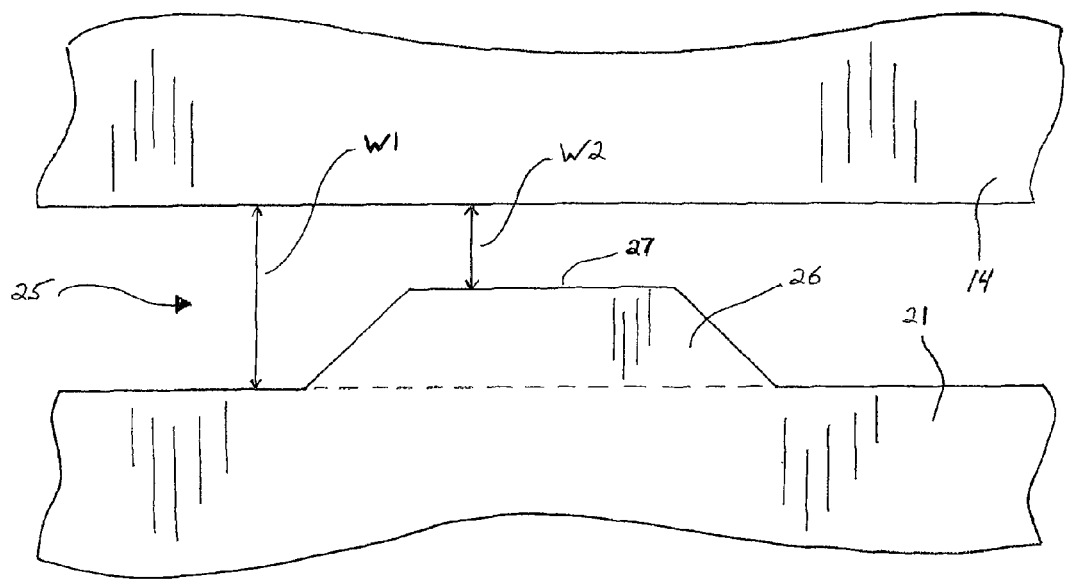
FIG. 6 is an enlarged plan view of a first side of a travel limiting structure as shown in FIG. 5
Figure 7:
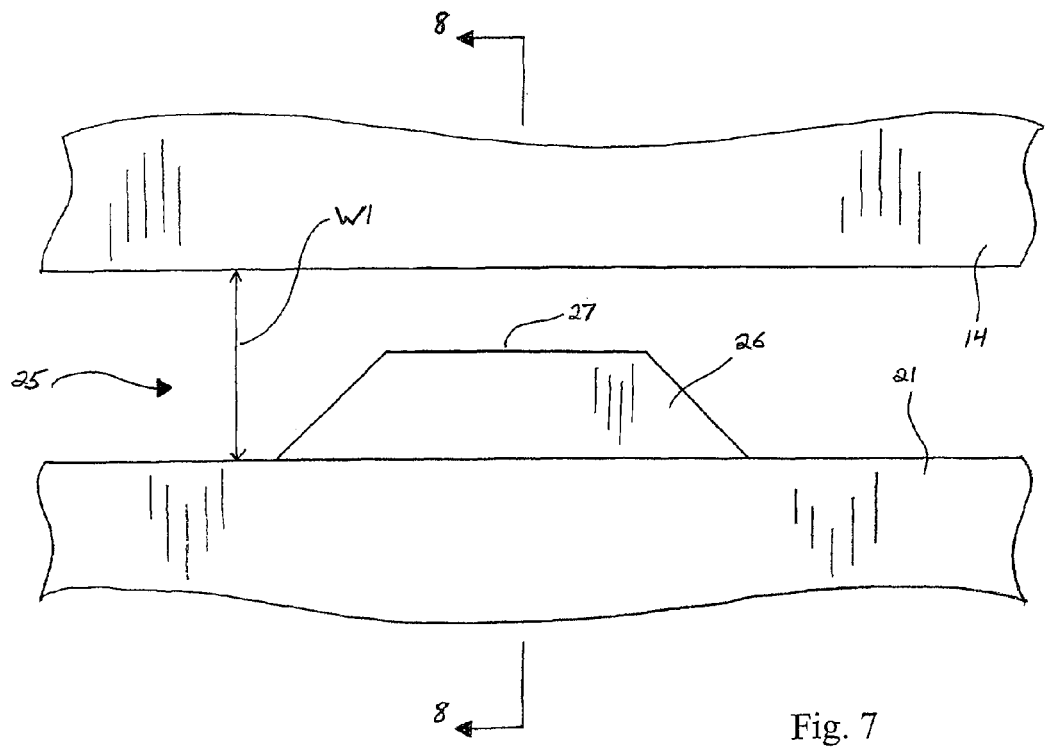
FIG. 7 is an enlarged plan view of a second side of a travel limiting structure as shown in FIG. 5.

In a second step, 102, the travel limiting structure 25 is formed in the proper configuration. In the exemplary embodiment, the bosses 26 can be formed during the process of removing material from the intermediate layer by creating slots through the intermediate layer to form the movable parts of the microvalve 10. To accomplish this, the width of the slots are made thinner in strategically selected locations, thereby forming the bosses 26 that limit the undesired motion of the movable parts. The bosses 26 may be formed through the whole depth of the intermediate layer. However, if etching is the process being used to form the microvalve 10, a longer time is typically required to etch thinner sections of the slots formed to create movable parts of the microvalve 10. Therefore, to expedite manufacturing, the slot pattern may be etched from a first side of the intermediate layer of a uniform greater width W1 (for example, about 70 microns) in portions except in a location where a boss 26 is to be formed, in which location a relatively thinner width slot of a lesser width W2 (for example, about 40 microns) is formed to define an end face 27 of the boss, as shown in FIG. 6. This etching process will act to form the slots part way through the depth of the material of the intermediate layer. Then, a second side of the intermediate layer is etched relatively more quickly with a pattern creating a slot uniformly of the greater width W1 (i.e., about 70 microns) part way through the intermediate layer to communicate with the slot formed from the first side, as shown in FIG. 7, so that the slot formed on the first side cooperates with the slot formed on the second side of the intermediate layer to create a combined slot that extends completely through the material of the intermediate layer, freeing the movable elements to move relative to the fixed portion 21 with a boss 26 extending into the combined slot.

Figure 8:
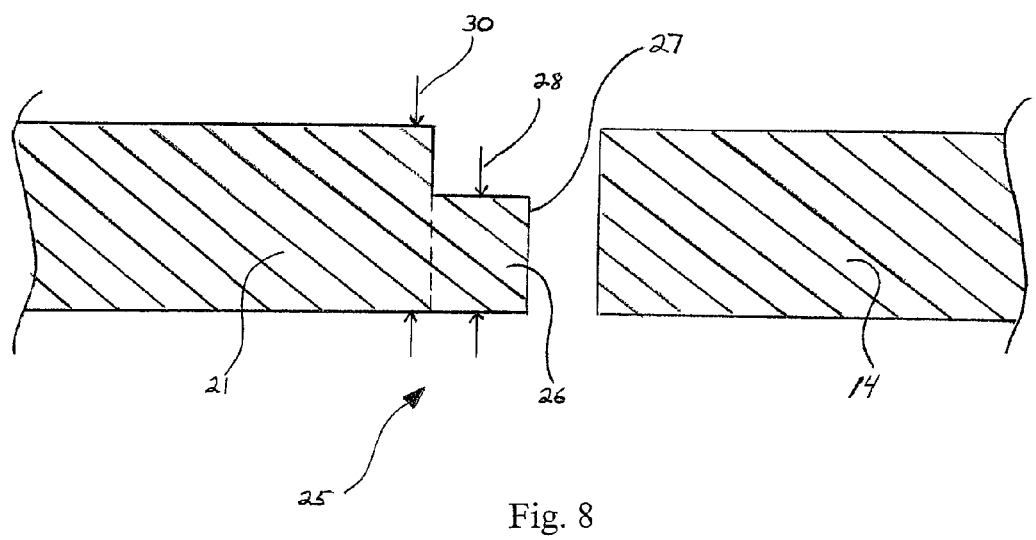
FIG. 8 is a sectional view of the travel limiting structure taken along the line 8-8 of FIG. 7.
Figure 9:
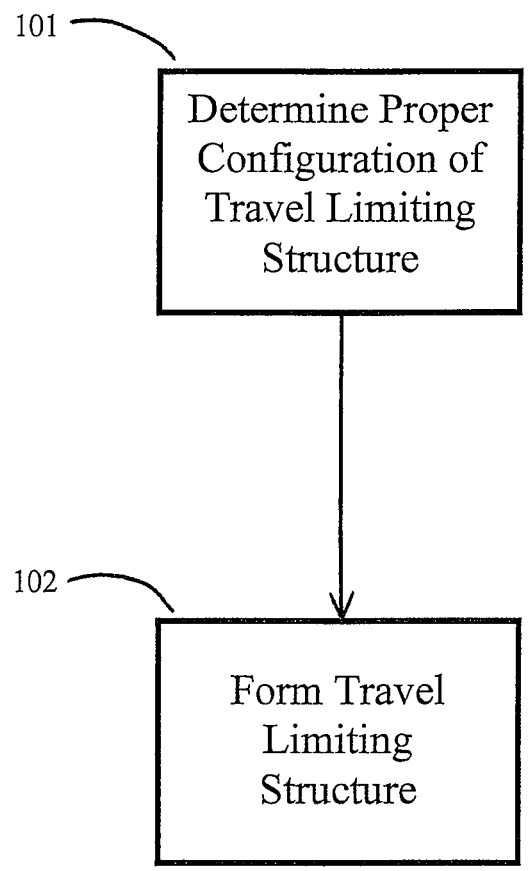
FIG. 9 is a block diagram showing a method of manufacturing a travel limiting structure as embodied in this invention.

The resulting bosses 26 that are formed by etching the narrow portions of the slot only need to extend part way through the depth of the portion on which the bosses 26 are formed. With this arrangement, much of the material of the intermediate layer can be etched through quickly, as only a fraction of the intermediate layer must be etched through at the slower rate of etching achievable while etching the slot with narrow portions, thus reducing the amount of time required to form the bosses 26. For example in FIG. 8, there is illustrated one of the bosses 26 having a depth 28 formed on a fixed portion 21 of the body. The depth 28 of the boss 26 is less than the depth 30 of a combined slot extending completely through the fixed portion 21. Only material of the thickness of the depth 28 of the boss 26 need be etched at a relatively slow rate. The remaining material of the intermediate layer can be etched at a relatively fast rate. It should be appreciated that the boss 26 may be formed on the movable valve element 14 in similar fashion.

In accordance with the provisions of the patent statutes, the principle mode of operation of this invention have been explained and illustrated in its preferred embodiments. However, it must be understood that this invention may be practiced otherwise than as specifically explained and illustrated without departing from its spirit or scope.

REFERENCE NUMBERS USED IN APPLICATION

A direction of motion of actuated spine 18
B direction of rotary motion of valve element on actuation
C direction of axial motion of valve element subjected to external shock
10 microvalve
12 actuator
14 valve element
16 ribs
18 spine
20 hinge
21 fixed portion of valve body
22 microvalve ports
24 openings through valve element to equalize pressure, etc.
25 travel limiting structure
26 travel limiting boss
27 end face of boss
28 depth of travel limiting boss
30 depth of fixed portion of valve body
101 method of determining proper configuration for travel limiting structure
102 method of forming travel limiting structure

What is claimed is:

1. A microvalve device comprising:
   a body;
   a valve element supported by the body;
   an actuator operatively coupled to the valve element for moving the valve element arcuately in a normal range of travel substantially within a plane defined in fixed relationship with the body; and
   a travel limiting structure operatively cooperating with the valve element, the travel limiting structure being effective to limit movement of the valve element within the plane but outside the normal range of travel to prevent failure of the body, the valve element or the actuator due to exceeding failure stress limits.

2. The microvalve of claim 1, wherein:
   the normal range of travel of the valve element defines a path of arcuate motion within the plane; and
   the travel limiting structure is effective to limit movement of the valve element in a radial direction relative to the path of arcuate motion to prevent failure of the body, the valve element, or the actuator due to exceeding failure stress limits.

3. The microvalve of claim 1, wherein:
   the normal range of travel of the valve element defines a path of arcuate motion; and
   the travel limiting structure is effective to limit the magnitude of arcuate movement of the valve element, beyond the normal range of travel, to prevent failure of the body, the valve element, or the actuator due to exceeding failure stress limits.

4. The microvalve of claim 1, wherein the travel limiting structure includes at least one boss.

5. The microvalve of claim 2, wherein the travel limiting structure is effective to limit the magnitude of arcuate movement of the valve element beyond the normal range of travel to prevent failure of the body, the valve element, or the actuator due to exceeding failure stress limits.

6. The microvalve of claim 1, wherein
   the normal range of travel of the valve element defines a path of arcuate motion within the plane; and
   the travel limiting structure is effective to limit at least one of:
      movement of the valve element within the plane in a radial direction relative to the path of arcuate motion to prevent failure of the body, the valve element, or the actuator due to exceeding failure stress limits; and
      arcuate movement of the valve element within the plane beyond the normal range of travel to prevent failure of the body, the valve element, or the actuator due to exceeding failure stress limits.

7. The microvalve of claim 4, wherein the boss is formed on a fixed portion of the body.

8. The microvalve of claim 4, the boss having a depth perpendicular to the plane and the fixed portion of the body having a depth perpendicular to the plane wherein the depth of the boss is less than the depth of the fixed portion.

9. The microvalve of claim 7, the boss having a depth perpendicular to the plane and the fixed portion of the body having a depth perpendicular to the plane, wherein the depth of the boss is less than the depth of the fixed portion.

10. The microvalve of claim 4, wherein the boss is formed on the valve element.

11. The microvalve of claim 10, the boss having a depth perpendicular to the plane and the valve element having a depth perpendicular to the plane, wherein the depth of the boss is less than the depth of the valve element.

12. A microvalve device comprising:
    a body, the body having a fixed portion;
    a plurality of movable elements including:
       a valve element supported by the body; and
       an actuator operatively coupled to the valve element for rotating the valve element in an arc within a normal range of travel, the arcuate movement of the valve element in the normal range of travel defining a plane; and
    a travel limiting structure operatively coupled to at least one of the body, the valve element, and the actuator, the travel limiting structure being effective to limit the magnitude of a movement, in a direction which has a component that is in the plane, of at least one of the movable elements outside the normal range of travel to prevent failure of at least one of the body and the movable elements due to exceeding failure stress limits.

13. A method of manufacturing a microvalve device having fixed valve parts and movable valve parts comprising the steps of:
    (a) determining a proper configuration of a travel limiting structure effective to permit arcuate movement of the moveable valve parts in a normal range of motion parallel to a plane that is fixed relative to the fixed valve parts and effective to limit movement of movable valve parts within the plane but outside the normal range of travel to prevent failure of the movable valve parts; and
    (b) forming the travel limiting structure.

14. The method of claim 13, wherein step (b) includes etching a slot through a layer of material, the slot having a thinner slot width in at least one location such that the slot forms at least one boss.

15. The method of claim 13, wherein step (b) includes the steps of:
    (b1) etching a first side of a layer of material to form a slot of varying width part way through the layer; and
    (b2) etching the layer of material on a second side part way through the layer to form a slot of uniform width to a depth, such that the slot formed on the first side communicates with the slot formed on the second side to create a combined slot that extends through the layer of material with at least one boss extending into the combined slot.

16. A microvalve device comprising:
    a body, the body having a fixed portion within which a plane is defined;
    a plurality of movable elements including:
       a valve element movable relative to the body; and
       an actuator operatively coupled to the valve element for actuation of the valve element in a normal range of arcuate motion relative to the body when power is supplied to the actuator, the normal range of motion of the valve element lying substantially within the plane, the fixed portion, the valve element, and the actuator being designed such that actuation of the valve element by the actuator when power is supplied to the actuator causes stresses which are less than the yield point for the fixed portion, the valve element, and the actuator; and
    a travel limiting structure operatively coupled to at least one of the body, the valve element, and the actuator, the travel limiting structure being effective to limit the magnitude of an uncommanded movement within the plane but outside the normal range of travel of at least one of the movable elements to prevent failure of at least one of the body and the movable elements due to exceeding failure stress limits, the uncommanded movement being caused by a factor other than intentional operation of the actuator.

* * * * *